(12) United States Patent
Tamaki et al.

(10) Patent No.: US 9,837,463 B2
(45) Date of Patent: Dec. 5, 2017

(54) SOLID-STATE IMAGING DEVICE AND METHOD OF MANUFACTURING THE SAME

(71) Applicant: CANON KABUSHIKI KAISHA, Tokyo (JP)

(72) Inventors: Junya Tamaki, Tokyo (JP); Atsushi Kanome, Tokyo (JP); Shingo Kitamura, Fujisawa (JP); Takehiro Toyoda, Machida (JP); Masaki Kurihara, Koza-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/149,767

(22) Filed: May 9, 2016

(65) Prior Publication Data

US 2016/0336369 A1   Nov. 17, 2016

(30) Foreign Application Priority Data

May 14, 2015   (JP) .................................. 2015-099485

(51) Int. Cl.
*H01L 27/14*   (2006.01)
*H01L 27/146*   (2006.01)

(52) U.S. Cl.
CPC .. *H01L 27/14685* (2013.01); *H01L 27/14609* (2013.01); *H01L 27/14627* (2013.01); *H01L 27/14636* (2013.01); *H01L 27/1462* (2013.01)

(58) Field of Classification Search
CPC ......... H01L 27/14685; H01L 27/14627; H01L 27/14609; H01L 27/14636; H01L 27/1462; H01L 27/14843; H01L 27/14812; H01L 27/1463; H04N 9/045
USPC ........................................................ 257/432
See application file for complete search history.

(56) References Cited

U.S. PATENT DOCUMENTS

| | | | | |
|---|---|---|---|---|
| 2010/0288911 | A1* | 11/2010 | Mizuta ............... | H01L 27/14632 250/208.1 |
| 2011/0233702 | A1* | 9/2011 | Takahashi ......... | H01L 21/76898 257/432 |

FOREIGN PATENT DOCUMENTS

JP   11-40787 A   2/1999

* cited by examiner

*Primary Examiner* — Caleen Sullivan
(74) *Attorney, Agent, or Firm* — Canon USA, INC., IP Division (57) ABSTRACT

A solid-state imaging device has a first area in which a plurality of pixels are provided, a second area provided on an outer side with respect to the first area, and a third area provided on the outer side with respect to the second area. An inner-lens layer provided over the first to third areas has an opening. An insulating film provided below the inner-lens layer also has an opening.

13 Claims, 8 Drawing Sheets

SOLID-STATE IMAGING DEVICE AND METHOD OF MANUFACTURING THE SAME

BACKGROUND OF THE INVENTION

Field of the Invention

One disclosed aspect of the embodiments relates to a solid-state imaging device and a method of manufacturing the same.

Description of the Related Art

In recent years, the reduction in the size of a single pixel has been accelerated with the increase in the number of pixels included in a single solid-state imaging device. In such a solid-state imaging device, a reduction in the size of the pixel may lead to a reduction in the area of a light-receiving surface of a photoelectric conversion portion and then to a reduction in the sensitivity of the photoelectric conversion portion. To suppress such a reduction in the sensitivity, a configuration is disclosed by Japanese Patent Laid-Open No. 11-40787 in which an inner lens is provided between a photoelectric conversion portion and an on-chip lens. According to Japanese Patent Laid-Open No. 11-40787, the inner lens is formed from a silicon nitride film or a silicon oxynitride film.

According to Japanese Patent Laid-Open No. 11-40787, relevant elements such as charge-transfer portions and wiring layers are formed on a substrate, a transparent film made of a material such as silicon nitride or silicon oxynitride is formed thereon by plasma chemical-vapor deposition (CVD), and a resist layer is formed thereon by applying a resist thereto. Subsequently, the resist layer is patterned and is subjected to reflowing, and the transparent film is etched by using the resist pattern as a mask, whereby inner lenses are formed. In such a manufacturing method, the resist layer formed on the transparent film tends to be patterned by using a mask positioned with reference to a pattern formed at a position that is nearer to the substrate than the transparent film is.

In the process disclosed by Japanese Patent Laid-Open No. 11-40787, a stress occurring in the transparent film may distort the substrate. In such an event, the predetermined pattern and the mask may be misaligned with each other. Consequently, the inner lenses formed by patterning the transparent film may be displaced from respective desired positions, resulting in failure in providing a highly reliable solid-state imaging device.

SUMMARY OF THE INVENTION

Accordingly, one disclosed aspect of the embodiments provides a solid-state imaging device that remain highly reliable even if a stress occurs in a layer that forms inner lenses that are made of a material such as silicon nitride or silicon oxynitride, and also provides a method of manufacturing such a solid-state imaging device.

According to an aspect of the embodiments, a solid-state imaging device includes a semiconductor substrate having a first area in which a plurality of pixels are provided or disposed, a second area provided, or disposed, on an outer side with respect to the first area and in which a circuit that controls the plurality of pixels is provided or disposed, and a third area provided or disposed on the outer side with respect to the second area; a plurality of wiring layers provided or disposed above the semiconductor substrate in such a manner as to spread over the first area and the second area; an insulating film provided or disposed above a topmost one of the plurality of wiring layers in such a manner as to spread over the first area, the second area, and the third area, the insulating film having a first opening in the third area; and an inner-lens layer provided or disposed above the insulating film in such a manner as to spread over the first area, the second area, and the third area, the inner-lens layer having an inner lens in the first area. The inner-lens layer has a second opening on the outer side with respect to the second area, the second opening being continuous with the first opening.

Further features of the disclosure will become apparent from the following description of exemplary embodiments with reference to the attached drawings.

DESCRIPTION OF THE EMBODIMENTS

The present inventors have examined forming a slit structure in a silicon nitride film or a silicon oxynitride film, before forming a resist layer, so as to reduce the stress that may occur in the silicon nitride film or the silicon oxynitride film. In this examination, the present inventors have found that the position, the depth, and other factors of the slit structure need to be determined carefully so as to enhance the reliability of a solid-state imaging device, and have reached the disclosure. Specific exemplary embodiments of the disclosure will now be described.

First Embodiment

Figure 1A:
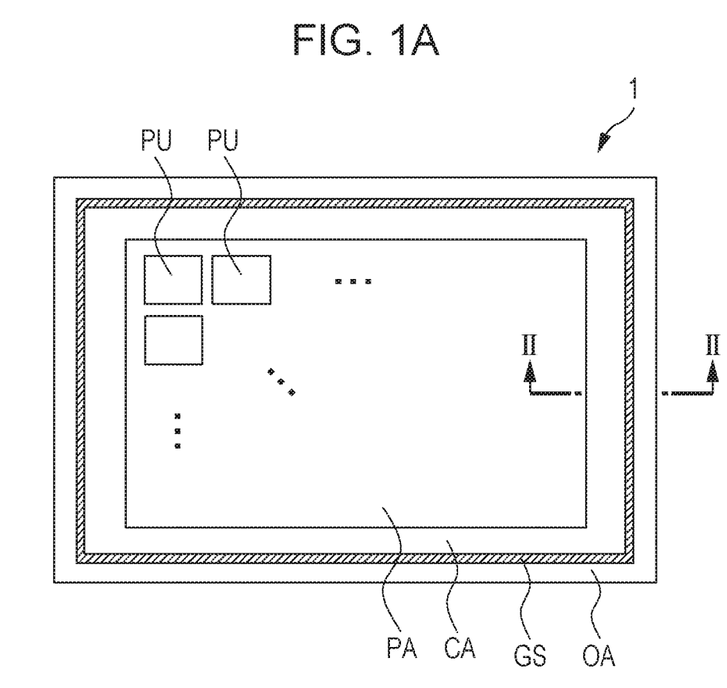
FIGS. 1A and 1B are diagrams illustrating a solid-state imaging device according to a first embodiment.
Figure 1B:
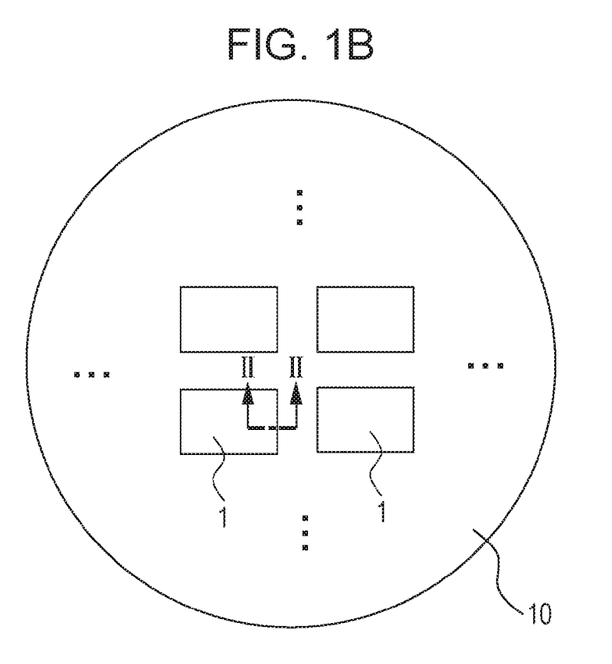
Figure 2:
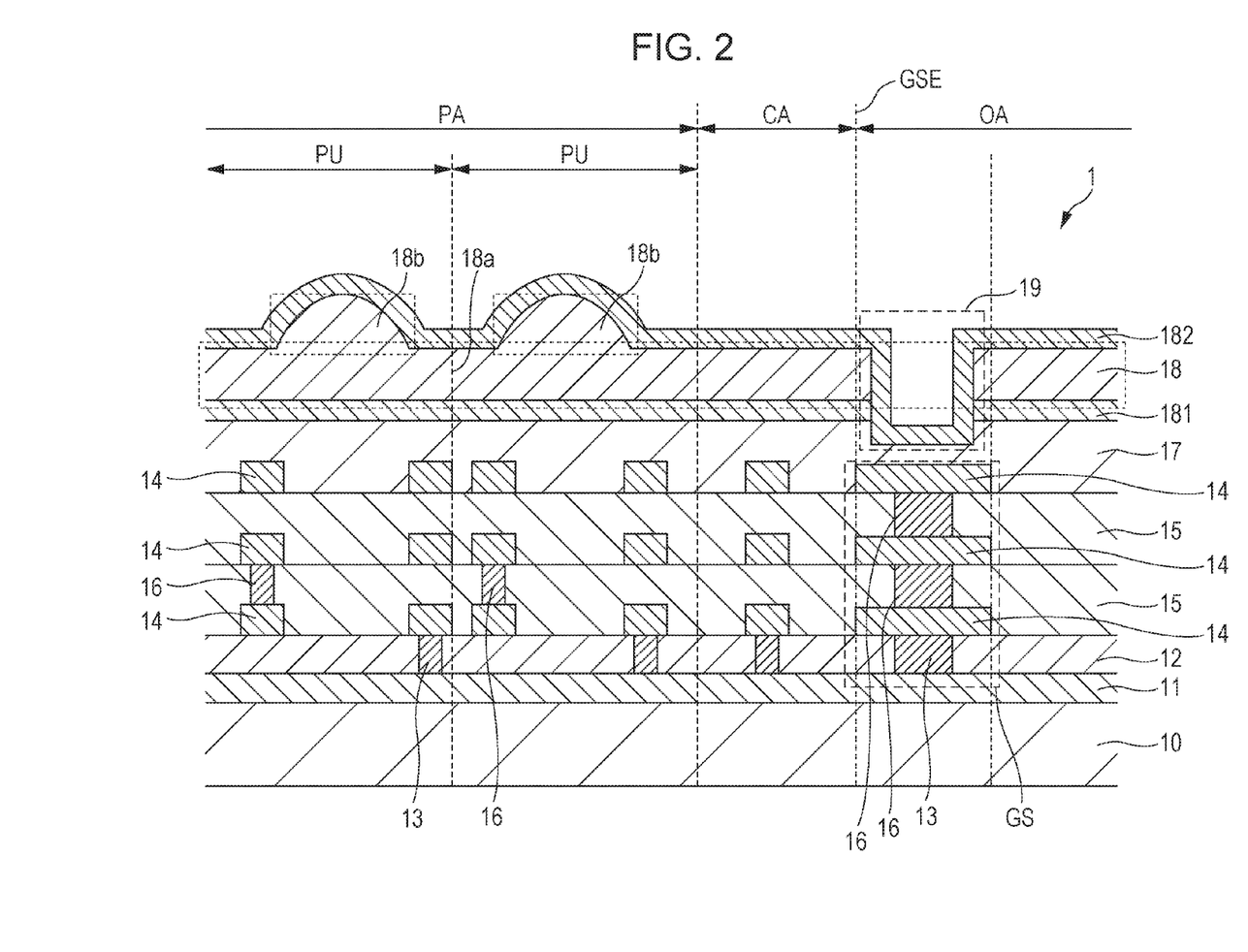
FIG. 2 is another diagram illustrating the solid-state imaging device according to the first embodiment.

FIG. 1B is a plan view of a semiconductor substrate 10. FIG. 1A illustrates a solid-state imaging device 1 according to a first embodiment. The semiconductor substrate 10 is cut into pieces, whereby a plurality of solid-state imaging devices 1 are obtained. FIG. 2 is a sectional view of the solid-state imaging device 1 according to the first embodiment that is taken along line II-II illustrated in FIGS. 1A and 1B.

As illustrated in FIG. 1A, the solid-state imaging device 1 according to the first embodiment has a pixel area PA (a first area) and a peripheral area CA (a second area) provided on the outer side with respect to the pixel area PA. In the plan view of the semiconductor substrate 10, a side nearer to the center of each solid-state imaging device 1 is referred to as "inner side," and a side nearer to the outer edge of the solid-state imaging device 1 is referred to as "outer side."

The pixel area PA is provided with a plurality of pixels PU that are arranged in a matrix pattern. The pixels PU each include a transfer transistor that transfers electric charge generated in a photoelectric conversion portion, a reset transistor, an amplification transistor, a selection transistor, and so forth.

The peripheral area CA is provided with a peripheral circuit that controls the plurality of pixels PU provided or disposed in the pixel area PA. An outer peripheral area OA (a third area) is provided or disposed on the outer side with respect to the peripheral area CA. A protective structure GS (a guard ring) is provided or disposed in the outer peripheral area OA. In the plan view, the protective structure GS surrounds the pixel area PA and the peripheral area CA. The protective structure GS protects the pixel area PA and the peripheral area CA from water or the like that may permeate the solid-state imaging device 1 from the outside.

Referring to FIG. 2, the semiconductor substrate 10 is provided or disposed thereon with a functional-element layer 11. The semiconductor substrate 10 can be made of silicon or the like. The functional-element layer 11 includes a plurality of photoelectric conversion portions, a plurality of transistors, element-isolating structures, and so forth.

The functional-element layer 11 is provided or disposed thereon with an interlayer insulating film 12, which spreads over the pixel area PA, the peripheral area CA, and the outer peripheral area OA. The interlayer insulating film 12 can be made of, for example, silicon oxide. To provide electrical continuity between the structures in the functional-element layer 11 and layers provided above the interlayer insulating film 12, a contact-plug layer 13 is provided in the interlayer insulating film 12. The contact-plug layer 13 can be made of, for example, metal that is chiefly composed of tungsten, or a compound of such metal.

The interlayer insulating film 12 is provided thereon with a plurality of wiring layers 14, a plurality of interlayer insulating films 15, and a plurality of via-plug layers 16. The wiring layers 14, the interlayer insulating films 15, and the via-plug layers 16 each spread over the pixel area PA, the peripheral area CA, and the outer peripheral area OA. While FIG. 2 illustrates a case where three wiring layers 14 are provided, the number of wiring layers 14 may be determined according to need.

The plurality of wiring layers 14 can be made of, for example, metal chiefly composed of aluminum or copper, or a compound of such metal. The interlayer insulating films 15 can be made of, for example, silicon oxide. The via-plug layers 16 can be made of, for example, metal that is chiefly composed of tungsten, or a compound of such metal.

The protective structure GS provided or disposed on the outer side with respect to the peripheral area CA is a multilayer structure including a part of the contact-plug layer 13, a part of each of the plurality of wiring layers 14, and a part of each of the plurality of via-plug layers 16. As illustrated in FIG. 1A, the protective structure GS surrounds the pixel area PA and the peripheral area CA. That is, the part of the contact-plug layer 13, the part of each of the plurality of wiring layers 14, and the part of each of the plurality of via-plug layers 16 included in the protective structure GS each surround the pixel area PA.

A topmost one of the wiring layers 14 is provided or disposed thereon with an insulating film 17. The insulating film 17 is a nitrogen-less silicon film, such as a silicon-oxide film, so as to reduce the stress that may occur in the insulating film 17. After the insulating film 17 is formed, the insulating film 17 may be planarized by chemical mechanical polishing (CMP).

The insulating film 17 is provided or disposed thereon with an inner-lens layer 18. The inner-lens layer 18 includes a flat portion 18a and hemispherical portions 18b. The flat portion 18a spreads over the pixel area PA, the peripheral area CA, and the outer peripheral area OA. The hemispherical portions 18b are provided in the respective pixels PU. The hemispherical portions 18b are to become inner lenses. The topmost one of the wiring layers 14 is also regarded as a wiring layer 14 that is nearest to the inner-lens layer 18.

The inner-lens layer 18 is provided or disposed thereon with a first planarization layer (not illustrated), which spreads over the pixel area PA, the peripheral area CA, and the outer peripheral area OA. The first planarization layer is provided thereon with color filters (not illustrated). The color filters are provided for the respective pixels PU. The color filters are covered with a second planarization layer (not illustrated), which spreads over the pixel area PA, the peripheral area CA, and the outer peripheral area OA. The second planarization layer is provided or disposed thereon with microlenses (not illustrated). The microlenses are provided for the respective pixels PU.

To make the refractive index of the inner-lens layer 18 higher than those of the first planarization layer and the second planarization layer, the inner-lens layer 18 can be made of, for example, silicon nitride or silicon oxynitride. The inner-lens layer 18 can be formed by providing a film of silicon nitride or the like by plasma CVD or the like and then patterning the film by photolithography or etching. The first and second planarization layers can be formed by applying an organic resin by spin-coating or the like. The microlenses can be formed by applying an organic resin by spin-coating or the like and then patterning the resin by photolithography or etching.

The solid-state imaging device 1 according to the first embodiment further includes an antireflection film 181 under the inner-lens layer 18, and an antireflection film 182 on the inner-lens layer 18. The antireflection films 181 and 182 can be made of silicon nitride, or silicon oxynitride or the like having a lower refractive index than silicon nitride. The insulating film 17 can be made of silicon oxide or the like having a lower refractive index than silicon oxynitride.

If the materials of the above elements are selected appropriately, the refractive indices of the first and second planarization layers and the microlenses can each be set to about 1.6, the refractive index of the antireflection film 182 can be set to about 1.7, the refractive index of the inner-lens layer 18 can be set to about 2.0, the refractive index of the antireflection film 181 can be set to about 1.7, and the refractive index of the insulating film 17 can be set to about 1.5. Thus, the refractive index of the inner-lens layer 18 is made higher than that of the first planarization layer. Consequently, light that is incident on the inner-lens layer 18 through the first planarization layer is refracted in such a manner as to enhance the effect of condensation of light on the photoelectric conversion portion of each of the pixels PU. Furthermore, since the refractive index of the antireflection film 182 is higher than that of the first planarization layer and lower than that of the inner-lens layer 18, the amount of reflection of light that is incident on the antireflection film 182 and the inner-lens layer 18 through the first planarization layer is reduced. Furthermore, since the refractive index of the antireflection film 181 is higher than that of the insulating film 17 and lower than that of the inner-lens layer 18, the amount of reflection of light that is incident on the antireflection film 181 and the insulating film 17 through the inner-lens layer 18 is reduced.

Furthermore, since the inner-lens layer 18 and the antireflection films 181 and 182 are made of silicon nitride or silicon oxynitride, permeation of water or any other substance from the outside of the solid-state imaging device 1 into the pixel area PA and the peripheral area CA is suppressed more than in a case where the layers 18, 181, and 182 are made of silicon oxide.

In the solid-state imaging device 1 according to the first embodiment illustrated in FIG. 2, a slit structure 19 extends through the inner-lens layer 18 and the antireflection film 181 on the outer side with respect to an inner peripheral edge GSE of the protective structure GS. While FIG. 2 illustrates a case where the slit structure 19 is provided only in a region vertically above the protective structure GS, the slit structure 19 may be provided in, in plan view, any region of the outer peripheral area OA that does not overlap the protective structure GS. Alternatively, in plan view, the slit structure 19 may spread over the region overlapping the protective structure GS and the region of the outer peripheral area OA that does not overlap the protective structure GS. In this specification, the slit structure 19 is an opening. Note that any opening provided in a manufacturing step is referred to as "opening" or "slit structure," whether or not it is filled with any material in a later manufacturing step.

Figure 3A:
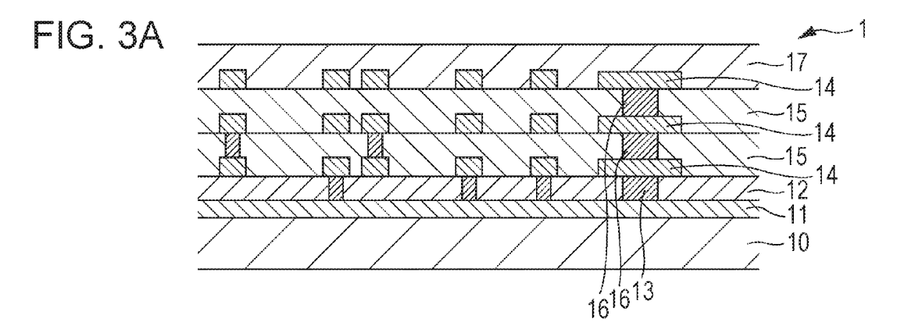
FIGS. 3A to 3C are diagrams illustrating steps of manufacturing the solid-state imaging device according to the first embodiment.

FIG. 3A illustrates one of steps of manufacturing the solid-state imaging device 1, in which layers up to the insulating film 17 have been formed.

Figure 3B:
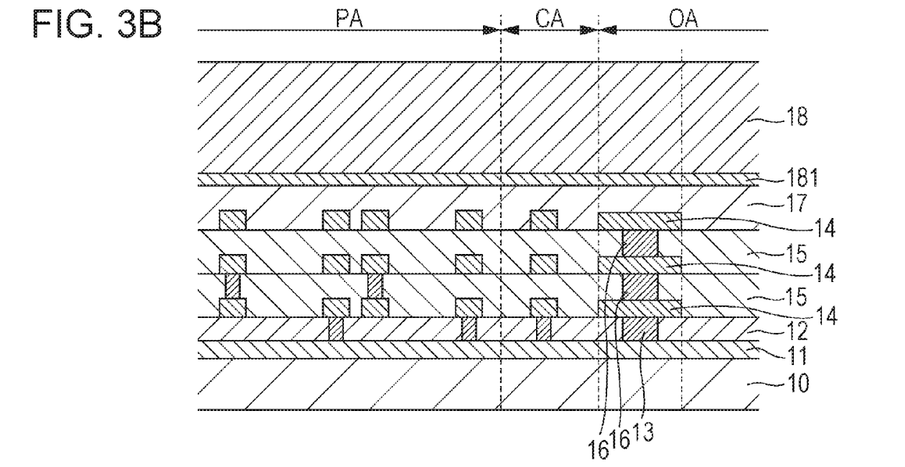

Referring now to FIG. 3B, a film of silicon oxynitride or the like is formed on the insulating film 17 over the pixel area PA, the peripheral area CA, and the outer peripheral area OA by plasma CVD or the like, whereby an antireflection film 181 is formed. Then, an inner-lens layer 18 made of silicon nitride or the like is formed on the antireflection film 181 over the pixel area PA, the peripheral area CA, and the outer peripheral area OA by plasma CVD or the like.

Figure 3C:
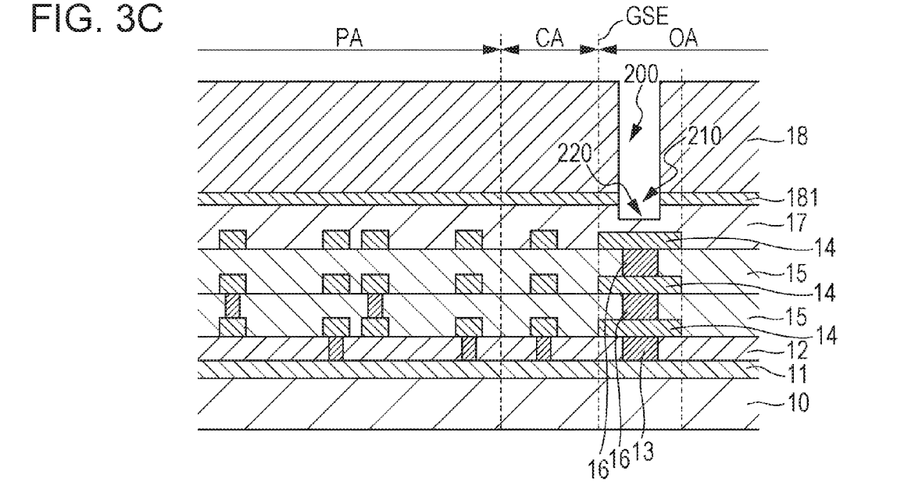

Referring now to FIG. 3C, a resist layer is formed on the inner-lens layer 18 and is patterned by photolithography, whereby a resist pattern having an opening extending along and on the outer side of the inner peripheral edge GSE of the protective structure GS is formed. The opening of the resist pattern is provided vertically above the protective structure GS.

Subsequently, using the resist pattern as a mask, the inner-lens layer 18 is etched. In this step, the inner-lens layer 18 and the antireflection film 181 are etched through, and a portion of the insulating film 17 is etched off. Thus, an opening 220 (a first opening) is provided in the insulating film 17, an opening 200 (a second opening) is provided in the inner-lens layer 18, and an opening 210 (a third opening) is provided in the antireflection film 181. The openings 200, 210, and 220 are combined together and later form a slit structure 19. Since the three layers 18, 181, and 17 are etched with one specific resist pattern, the openings 200, 210, and 220 are continuous with one another. Herein, the "opening" is a space provided by etching off a portion of a layer, and the term "opening" encompasses a state where the opening completely passes through the layer and a state where the opening does not completely pass through the layer.

Figure 4A:
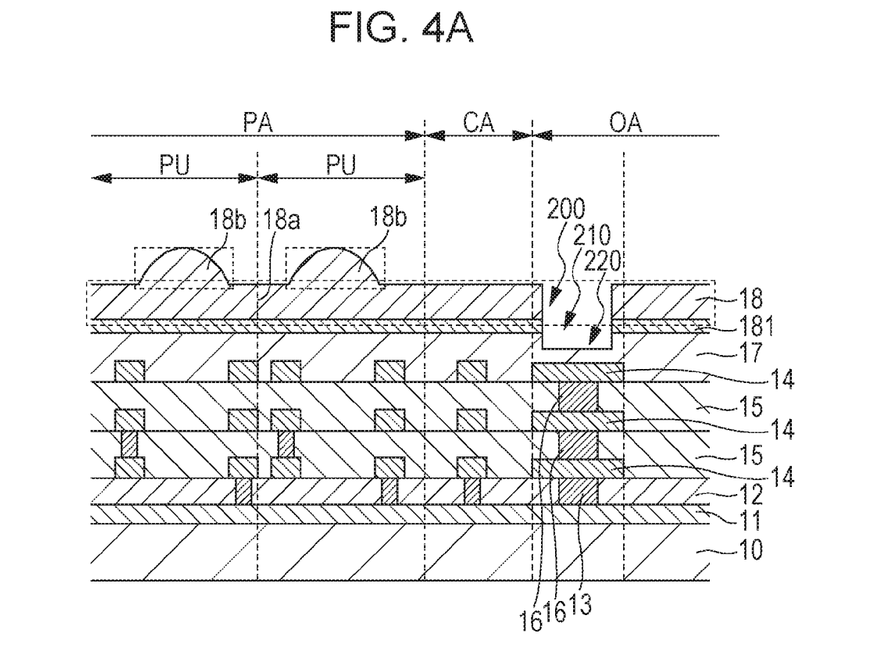
FIGS. 4A and 4B are diagrams illustrating other steps of manufacturing the solid-state imaging device according to the first embodiment.

In a step illustrated in FIG. 4A, a resist layer is formed on the inner-lens layer 18 and is patterned by photolithography, whereby a resist pattern is formed in the pixel area PA. In this step, the resist layer is patterned by using a mask intended for, for example, area-ratio gray-scale exposure. The mask is positioned with reference to a predetermined pattern formed in any layer that is nearer to the substrate 10 than the inner-lens layer 18 is. Subsequently, reflowing is performed on the patterned resist layer, whereby a resist pattern of, for example, hemispherical elements is formed. Then, the inner-lens layer 18 is etched by using the resist pattern as a mask, whereby a flat portion 18a and hemispherical portions 18b are formed. Thus, the inner-lens layer 18 is formed over the pixel area PA, the peripheral area CA, and the outer peripheral area OA.

Figure 4B:
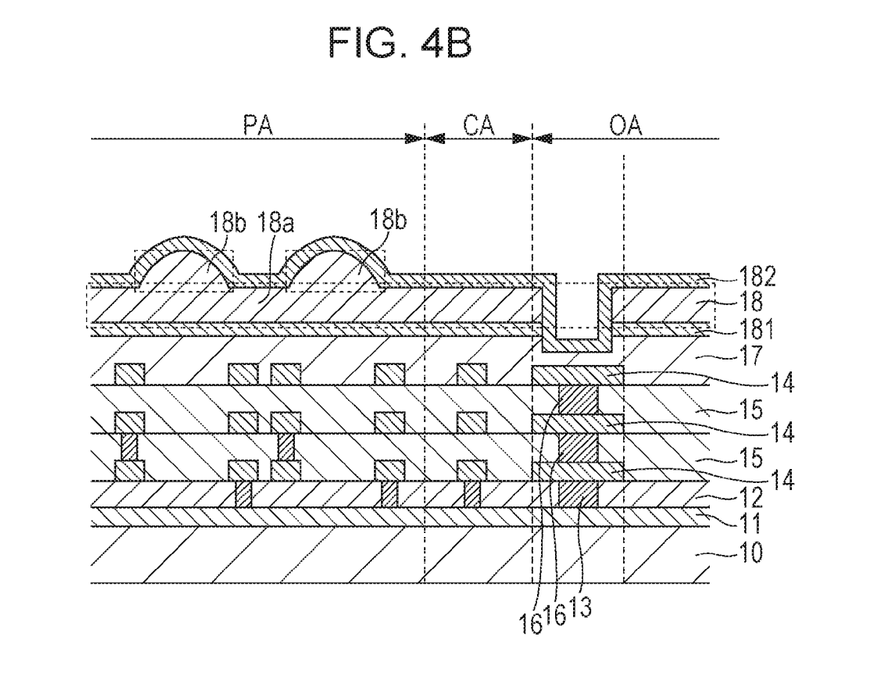

In a step illustrated in FIG. 4B, a film of silicon nitride, silicon oxynitride, or the like is formed on the inner-lens layer 18 over the pixel area PA, the peripheral area CA, and the outer peripheral area OA by plasma CVD or the like, whereby an antireflection film 182 is formed.

In the solid-state imaging device 1 according to the first embodiment, as illustrated in FIG. 3C, a portion of the inner-lens layer 18 that is on the outer side with respect to the inner peripheral edge GSE of the protective structure GS is etched off. That is, in the first embodiment, the slit structure 19 is formed in the inner-lens layer 18 in the step illustrated in FIG. 3C, in which the inner-lens layer 18 has largest thickness. In this step, the size of a continuous portion (with no slit) of the inner-lens layer 18 is reduced. Therefore, the probability of distortion of the substrate 10 due to the stress that may occur in the inner-lens layer 18 is reduced.

In general, the relationship between a film stress σ occurring in a film provided on a substrate and a curvature radius R of the substrate is expressed as follows:

$$\sigma = Es \cdot Ts^2 / 6 \cdot (1 - vs) \cdot R \cdot Tf \qquad (1)$$

where Es denotes the Young's modulus of the substrate, vs denotes the Poisson's ratio of the substrate, Ts denotes the thickness of the substrate, and Tf denotes the thickness of the film. The Young's modulus and the Poisson's ratio are material-specific constants. Therefore, according to Expression (1), the film stress σ occurring at a certain point of the substrate is defined only by the direction in which the film stress σ acts and the vertical configuration at that point. That is, the film stress σ is determined only by the type of the substrate and the type of the film. Furthermore, the curvature radius R at a certain point of the substrate that is under the film stress σ is defined only by the type of the substrate and the type of the film.

The distortion in the substrate 10 due to the film stress occurring in the inner-lens layer 18 is calculated by adding up values at different points of the substrate 10 in an area vertically below the continuous portion of the inner-lens layer 18. According to Expression (1), the curvature radius R is constant over the entirety of the substrate 10. Therefore, if the size of the continuous portion of the inner-lens layer 18 is reduced, the distortion of the substrate 10 is reduced.

As described above, in the solid-state imaging device 1 according to the first embodiment, the distortion of the substrate 10 is reduced by forming the slit structure 19 in the inner-lens layer 18 in the step illustrated in FIG. 3C. Hence, the probability of misalignment of the mask used in patterning the resist layer on the inner-lens layer 18 in the step illustrated in FIG. 4A is reduced. Consequently, a highly reliable solid-state imaging device and a method of manufacturing the same are provided.

In the first embodiment, the slit structure 19 is provided in a region on the outer side with respect to the inner peripheral edge GSE of the protective structure GS, whereas a region on the inner side with respect to the protective structure GS includes the inner-lens layer 18 and the antireflection films 181 and 182. In such a configuration, the permeation of water or the like from the outside of the solid-state imaging device 1 into the pixel area PA and the peripheral area CA is suppressed by the protective structure GS in a direction parallel to the surface of the substrate 10 and by the inner-lens layer 18 and the antireflection films 181 and 182 in the top-to-bottom direction.

In the solid-state imaging device 1 according to the first embodiment, the slit structure 19 is formed by etching up to a portion of the insulating film 17. Furthermore, the antireflection film 182 is provided over the inner-lens layer 18 in such a manner as to cover the sidewalls of the opening of the slit structure 19. That is, the antireflection film 182 is provided over the bottom surface and the sidewalls of the opening 220 provided in the insulating film 17, and the sidewalls of the opening 210 and the opening 200.

Figure 5:
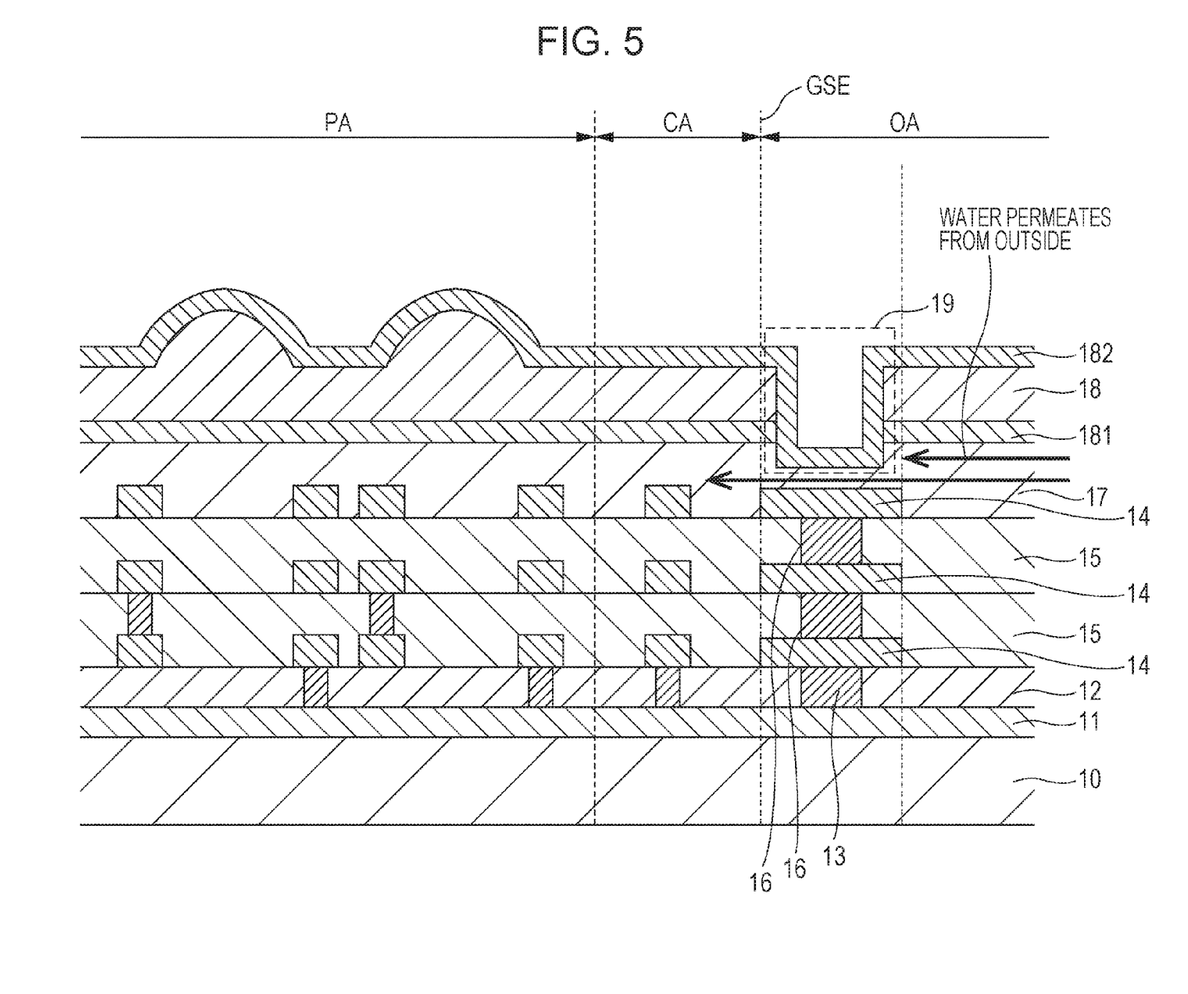
FIG. 5 is a diagram illustrating an advantageous effect exerted by the solid-state imaging device according to the first embodiment.

Arrows illustrated in FIG. 5 schematically represent paths of water permeation from the outside toward the pixel area PA and the peripheral area CA. According to the first embodiment, the slit structure 19 provided for reducing the film stress blocks some paths of water permeation through the insulating film 17 in the direction parallel to the surface of the substrate 10. Water is more likely to permeate through a silicon oxide film than through a silicon nitride film or a silicon oxynitride film. Therefore, if the insulating film 17 is made of silicon oxide and the antireflection films 181 and 182 are made of silicon nitride or silicon oxynitride, at least some paths of water permeation through the silicon oxide film are blocked. Thus, a reliable solid-state imaging device is provided.

Modifications

Figure 6:
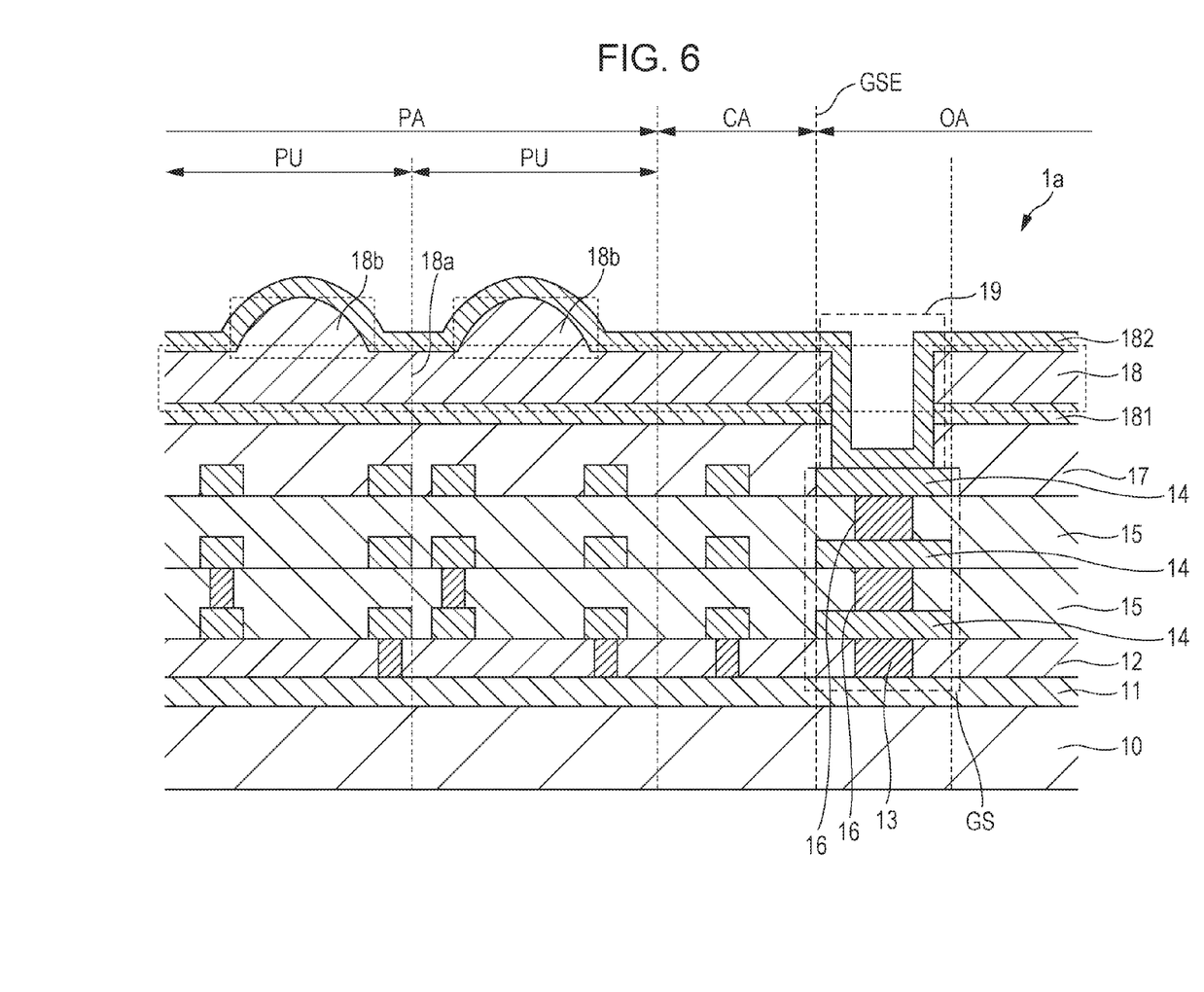
FIG. 6 is a diagram illustrating a solid-state imaging device according to a modification of the first embodiment.

FIG. 6 illustrates a solid-state imaging device 1a according to a modification of the first embodiment. In FIG. 6, elements that are the same as those included in the solid-state imaging device 1 are denoted by corresponding ones of the reference numerals used in FIGS. 2 to 5. The modification differs from the first embodiment in that the slit structure 19 reaches the topmost one of the wiring layers 14 included in the protective structure GS. In other words, the opening 220 of the insulating film 17 reaches the topmost one of the wiring layers 14 included in the protective structure GS. In such a configuration, more paths of water permeation through the insulating film 17 toward the inner side with respect to the protective structure GS are blocked than in the first embodiment illustrated in FIG. 2.

FIG. 6 illustrates a case where the slit structure 19 is provided only in a region vertically above the protective structure GS. Alternatively, in plan view, the slit structure 19 may be provided in any region of the outer peripheral area OA that does not overlap the protective structure GS. Moreover, in plan view, the slit structure 19 may extend over the region overlapping the protective structure GS and the region of the outer peripheral area OA that does not overlap the protective structure GS.

The first embodiment may also be modified such that the slit structure 19 has a loop shape surrounding the pixel area PA and the peripheral area CA. In such a modification, if the antireflection film 182 is provided in contact with the protective structure GS, the pixel area PA and the peripheral area CA are enclosed by the protective structure GS. Consequently, water permeation through the insulating film 17 toward the inner side with respect to the protective structure GS is blocked in all directions.

Second Embodiment

Figure 7A:
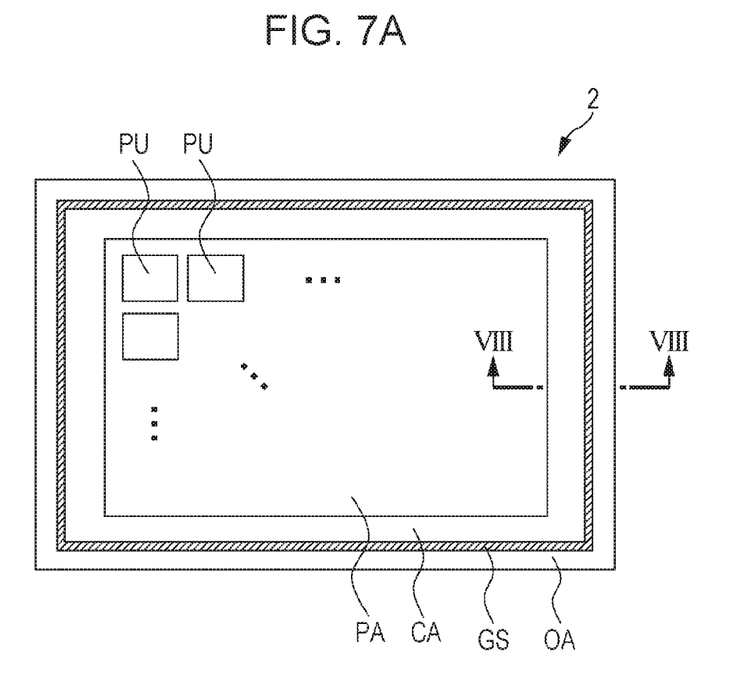
FIGS. 7A and 7B are diagrams illustrating a solid-state imaging device according to a second embodiment.
Figure 7B:
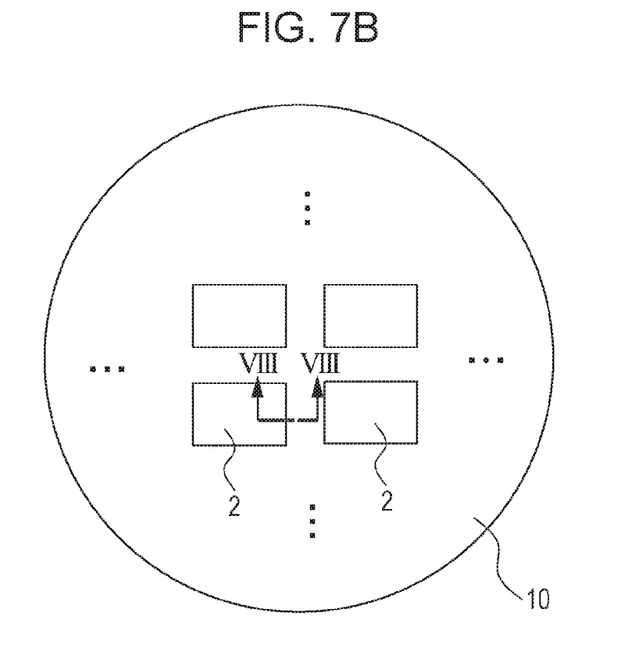

A second embodiment concerns a case where the slit structure 19 is provided in a region outside the solid-state imaging device. Referring to FIGS. 7A and 7B, the second embodiment will now be described, focusing on differences from the first embodiment.

Figure 8:
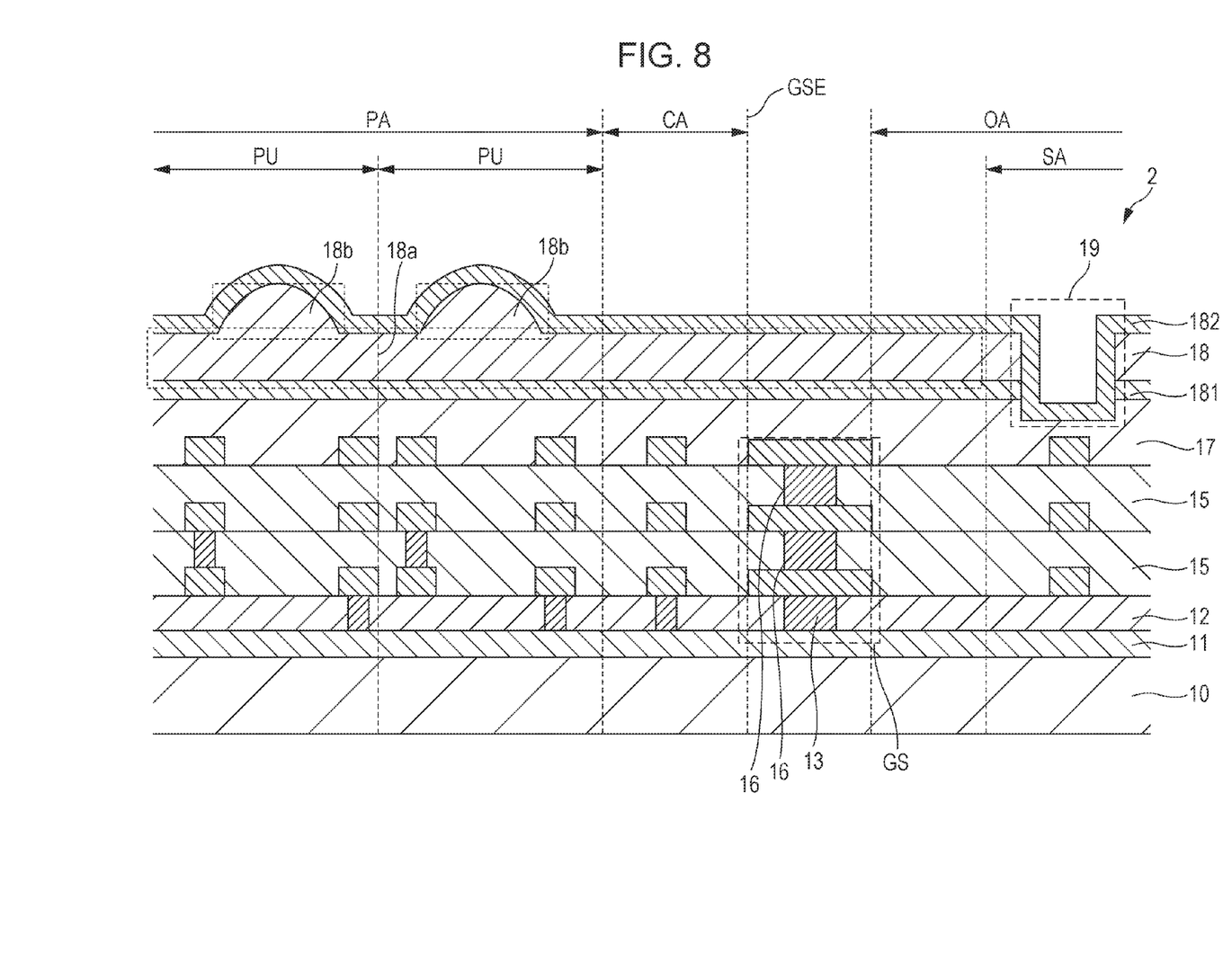
FIG. 8 is another diagram illustrating the solid-state imaging device according to the second embodiment.

FIG. 7A is a plan view of a solid-state imaging device 2 according to the second embodiment. FIG. 7B is a plan view of a substrate 10 that is in the process of manufacturing of solid-state imaging devices 2 according to the second embodiment and is yet to be cut into pieces of solid-state imaging devices 2, one of which is illustrated in FIG. 7A. FIG. 8 is a sectional view, taken along line VIII-VIII illustrated in FIGS. 7A and 7B, of the solid-state imaging device 2 according to the second embodiment that is in a manufacturing process.

The second embodiment differs from the first embodiment in that the slit structure 19 is provided in a scribe area SA. The manufacturing method according to the first embodiment is applicable to the second embodiment. The scribe area SA is an outer peripheral area (a third area) provided on the outer side with respect to the peripheral area CA in a manufacturing step.

In the second embodiment also, if the size of the continuous portion of the inner-lens layer 18 is reduced, the distortion of the substrate 10 due to the film stress occurring in the inner-lens layer 18 is reduced. Accordingly, a highly reliable solid-state imaging device is provided. In the second embodiment also, the slit structure 19 is formed by etching up to a portion of the insulating film 17, and the antireflection film 182 is in contact with the insulating film 17. Therefore, permeation of water or the like from the outside toward the pixel area PA and the peripheral area CA in manufacturing steps is suppressed, and a more reliable solid-state imaging device is provided.

The scribe area SA may be provided with a positioning-use pattern or the like at a position that is nearer to the substrate 10 than the antireflection film 181 is. In the second embodiment, since the slit structure 19 is provided in the scribe area SA, the visibility of the positioning-use pattern is improved.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2015-099485, filed May 14, 2015, which is hereby incorporated by reference herein in its entirety.

What is claimed is:

1. A solid-state imaging device comprising:
   a semiconductor substrate having a first area in which a plurality of pixels are provided, a second area provided on an outer side with respect to the first area and in which a circuit that controls the plurality of pixels is provided, and a third area provided on the outer side with respect to the second area;
   a plurality of wiring layers provided above the semiconductor substrate in such a manner as to spread over the first area and the second area;
   an insulating film provided above a topmost one of the plurality of wiring layers in such a manner as to spread over the first area, the second area, and the third area, the insulating film having a first opening in the third area;
   an inner-lens layer provided above the insulating film in such a manner as to spread over the first area, the second area, and the third area, the inner-lens layer having an inner lens in the first area; and a guard ring provided in the third area and including respective portions of the plurality of wiring layers and a portion of a via-plug layer, wherein the inner-lens layer has a second opening in the third area, the second opening being continuous with the first opening, and wherein a part of the insulating film is left under the first opening.

2. The solid-state imaging device according to claim 1, wherein the first opening of the insulating film and the second opening of the inner-lens layer are provided vertically above the guard ring.

3. The solid-state imaging device according to claim 1, wherein, in a plan view of the semiconductor substrate, the first opening of the insulating film and the second opening of the inner-lens layer each surround the first area and the second area.

4. The solid-state imaging device according to claim 1, wherein the insulating film is made of silicon oxide, and wherein the inner-lens layer is made of silicon nitride or silicon oxynitride.

5. A solid-state imaging device comprising:
a semiconductor substrate having a first area in which a plurality of pixels are provided, a second area provided on an outer side with respect to the first area and in which a circuit that controls the plurality of pixels is provided, and a third area provided on the outer side with respect to the second area;
a plurality of wiring layers provided above the semiconductor substrate in such a manner as to spread over the first area and the second area;
an insulating film provided above a topmost one of the plurality of wiring layers in such a manner as to spread over the first area, the second area, and the third area, the insulating film having a first opening in the third area;
an inner-lens layer provided above the insulating film in such a manner as to spread over the first area, the second area, and the third area, the inner-lens layer having an inner lens in the first area; and
an antireflection film provided above the inner-lens layer in such a manner as to spread over the first area, the second area, and the third area,
wherein the inner-lens layer has a second opening in the third area, the second opening being continuous with the first opening, and
wherein the antireflection film covers sidewalls of the first opening of the insulating film.

6. The solid-state imaging device according to claim 5, wherein the antireflection film covers sidewalls of the second opening of the inner-lens layer.

7. The solid-state imaging device according to claim 6, further comprising:
another antireflection film provided between the insulating film and the inner-lens layer in such a manner as to spread over the first area, the second area, and the third area,
wherein the another antireflection film has an opening that is continuous with the first opening of the insulating film and with the second opening of the inner-lens layer.

8. The solid-state imaging device according to claim 5, wherein the antireflection film is in contact with the topmost one of the plurality of wiring layers in the guard ring.

9. The solid-state imaging device according to claim 5, wherein the insulating film is made of silicon oxide, wherein the inner-lens layer is made of silicon nitride, and wherein the antireflection film is made of silicon oxynitride.

10. A solid-state imaging device comprising:
a semiconductor substrate having a first area in which a plurality of pixels are provided, a second area provided on an outer side with respect to the first area and in which a circuit that controls the plurality of pixels is provided, and a third area provided on the outer side with respect to the second area;
a plurality of wiring layers provided above the semiconductor substrate in such a manner as to spread over the first area and the second area;
an insulating film provided above a topmost one of the plurality of wiring layers in such a manner as to spread over the first area, the second area, and the third area, the insulating film having a first opening in the third area;
an inner-lens layer provided above the insulating film in such a manner as to spread over the first area, the second area, and the third area, the inner-lens layer having an inner lens in the first area; and
a planarization layer provided above the inner lens,
wherein the inner-lens layer has a second opening in the third area, the second opening being continuous with the first opening.

11. A solid-state imaging device comprising:
a semiconductor substrate having a first area in which a plurality of pixels are provided, a second area provided on an outer side with respect to the first area and in which a circuit that controls the plurality of pixels is provided, and a third area provided on the outer side with respect to the second area;
a plurality of wiring layers provided above the semiconductor substrate in such a manner as to spread over the first area and the second area;
a first insulating film provided above a topmost one of the plurality of wiring layers in such a manner as to spread over the first area, the second area, and the third area, the first insulating film having a first opening in the third area;
a second insulating film provided above the first insulating film in such a manner as to spread over the first area, the second area, and the third area; and
an antireflection film provided above the second insulating film in such a manner as to spread over the first area, the second area, and the third area,
wherein the second insulating film has a second opening in the third area, the second opening being continuous with the first opening, and
wherein the antireflection film covers sidewalls of the first opening of the first insulating film.

12. The solid-state imaging device according to claim 11, wherein the first insulating film is made of silicon oxide, wherein the second insulating film is made of silicon nitride, and
wherein the antireflection film is made of silicon oxynitride.

13. The solid-state imaging device according to claim 11, wherein the second insulating film has an inner lens in the first area.

* * * * *